United States Patent [19]

Takahashi et al.

[11] Patent Number: 5,151,772
[45] Date of Patent: Sep. 29, 1992

[54] SEMICONDUCTOR INTEGRATED CIRCUIT DEVICE

[75] Inventors: Yasushi Takahashi, Tachikawa; Hiromi Matsuura, Tokorozawa; Yoshihisa Koyama, Akishima; Masaya Muranaka, Akishima; Katsutaka Kimura, Akishima; Kazuyuki Miyazawa, Iruma; Masamichi Ishihara, Hamura; Hidetoshi Iwai, Ohme, all of Japan

[73] Assignees: Hitachi, Ltd., Tokyo; Hitachi VLSI Engineering Corp., Kodaira, both of Japan

[21] Appl. No.: 616,705

[22] Filed: Nov. 20, 1990

Related U.S. Application Data

[63] Continuation of Ser. No. 243,607, Sep. 13, 1988, abandoned.

[30] Foreign Application Priority Data

Sep. 19, 1987 [JP] Japan .................................. 62-235901
Dec. 18, 1987 [JP] Japan .................................. 62-320936

[51] Int. Cl.⁵ ..................... H01L 23/48; H01L 29/46; H01L 29/54; H01L 29/04
[52] U.S. Cl. ......................................... 357/71; 357/59
[58] Field of Search ........................ 357/71, 45, 59, 68

[56] References Cited

U.S. PATENT DOCUMENTS

| 3,881,971 | 5/1975 | Greer et al. | 156/11 |
|---|---|---|---|
| 4,045,302 | 8/1977 | Gibbs et al. | 204/15 |
| 4,278,989 | 7/1981 | Baba et al. | 357/59 |
| 4,392,150 | 7/1983 | Courreges | 357/51 |
| 4,488,166 | 12/1984 | Lehrer | 357/71 |
| 4,520,554 | 6/1985 | Fisher | 29/591 |
| 4,543,592 | 9/1985 | Itsumi et al. | 357/43 |
| 4,626,889 | 12/1986 | Yamamoto | 257/71 |
| 4,746,965 | 5/1988 | Nishi | 357/68 |
| 4,748,487 | 5/1988 | Uchida et al. | 357/43 |
| 4,825,276 | 4/1989 | Kobayashi | 357/45 |

FOREIGN PATENT DOCUMENTS

| 57190118 | 5/1984 | Japan | 357/45 |
|---|---|---|---|
| 59-114865 | 7/1984 | Japan | 357/45 |
| 58-67993 | 11/1984 | Japan | 357/71 |
| 59-194448 | 11/1984 | Japan | 357/43 |

OTHER PUBLICATIONS

Glasser et al., "The Design Analysis of VLSI Circuits" 1985 pp. 267-268.

Primary Examiner—Jerome Jackson, Jr.
Assistant Examiner—D. Monin
Attorney, Agent, or Firm—Antonelli, Terry Stout & Kraus

[57] ABSTRACT

A semiconductor integrated circuit device is provided which includes a memory cell array located in a generally central area of a semiconductor substrate with peripheral circuits located at both ends of the semiconductor substrate. A wiring layer is also provided which couples the peripheral circuits to one another. This wiring layer is arranged to have a double-layer structure of first and second aluminum layers which are electrically coupled to one another.

32 Claims, 9 Drawing Sheets

SEMICONDUCTOR INTEGRATED CIRCUIT DEVICE

This application is a continuation of application Ser. No. 243,607, filed on Sep. 13, 1988, now abandoned.

BACKGROUND OF THE INVENTION

The present invention relates to a semiconductor integrated circuit device. In particular, it relates to techniques which are effective when applied to a semiconductor integrated circuit device having at least two layers of aluminum wiring, more desirably, a semiconductor integrated circuit device including a DRAM (Dynamic Random Access Memory) having at least two layers of aluminum wiring.

In recent years, DRAMs of 1 [Mbit] or 4 [Mbits] each having two layers of aluminum wiring have been actively developed. They are described in, for example, "Denshi-Zairyō (Electronics Materials)," January 1986, pp. 39–44, and "Nikkei Microdevices, Extra Issue No. 1" issued by Nikkei McGraw-Hill Inc., May 1987, pp. 149–164. In any of these DRAMs, the second layer of aluminum wiring is used as shunt wiring for lowering the resistance of a word line made of a poly-cide. That is, the word line of the poly-cide and the second layer of aluminum wiring are laid in parallel and are connected to each other at predetermined intervals.

SUMMARY OF THE INVENTION

The memory cell of the above-mentioned DRAM for storing information of 1 [bit] is constructed of a series circuit consisting of a memory cell selecting MISFET and an information storing capacitor. The chip of the DRAM is mainly sealed with an SOJ (Small Out-line J-lead Package) or a ZIP (Zigzag In-line Package).

Resin-encapsulated products of this type have the sizes of packages and the arrangements of external leads stipulated on the basis of standards. Therefore, the arrangement of the individual circuits of the DRAM is determined to some extent in accordance with the stipulations.

A DRAM under development by the inventors has a rectangular chip. A memory cell array is arranged at the central part of the rectangular chip. The memory cell array occupies the greater part of the area of the rectangular chip. Peripheral circuits for driving the DRAM are respectively arranged on the opposing shorter latus sides of the rectangular chip. The peripheral circuits arranged on one shorter latus side (the upper latus side), principally include reference clock signal generators such as a row address strobe (RAS)-group circuit and a column address strobe (CAS)-group circuit. External terminals (bonding pads) for reference clock signals are arranged near the reference clock signal generators. The peripheral circuits arranged on the other shorter latus side (the lower latus side), principally include address-group circuits such as an X-address buffer and a Y-address buffer. Likewise, external terminals for address signals are arranged near the address-group circuits.

The acceptance of the address signals of the address-group circuits is controlled on the basis of the reference clock signals formed by the reference clock signal generators. To this end, the reference clock signal generators and the address-group circuits which are arranged along the respective opposing shorter latera of the rectangular chip are connected by reference clock signal-wiring leads. The reference clock signal-wiring leads are arranged in the small areas between the longer latera of the rectangular chip and the longer edges of the memory cell array so as to extend along these longer latera of the chip. Each of the reference clock signal-wiring leads is formed of the first layer or second layer of aluminum wiring. In case of the DRAM having a large memory capacity of 4 [Mbits], the reference clock signal-wiring lead needs to be laid from one shorter latus side to the other shorter latus side of the rectangular chip with a great wiring length of about 10 [mm]. In consequence, the reference clock signal is conspicuously delayed to decrease the margins of an address setup time and an address hold time. Another problem is that, since the decreases in the margins incur increase in an access time, the operating speed of the DRAM is lowered.

Besides, in the DRAM having the two layers of aluminum wiring as described above, the first layer of aluminum wiring and the second layers of aluminum wiring have equal thicknesses. In this case, at a part where the first and second layers of aluminum wiring intersect, a step ascribable to the first layer of aluminum wiring is large. This leads to the problem that the step coverage of the second layer of aluminum wiring at the intersection part thereof with the first layer of aluminum wiring is inferior, so the intersection part is liable to break.

An object of the present invention is to provide a technique which can heighten the operating speed of a semiconductor integrated circuit device including a DRAM.

Another object of the present invention is to provide a technique which can accomplish the first-mentioned object by heightening the propagating speed of a reference clock signal.

Another object of the present invention is to provide a technique which can prevent the breaking of the second layer of aluminum wiring at a stepped part ascribable to the first layer of aluminum wiring.

The above and other objects and novel features of the present invention will become apparent from the description of this specification and the accompanying drawings.

Typical aspects of performance of the present invention are briefly summarized as follows:

In a DRAM, a reference clock signal-generator and an address-group circuit which are respectively arranged on the opposing shorter latus sides of a rectangular chip are connected by a reference clock signal-wiring lead of double layer-wiring structure which extends along the longer latus of the rectangular chip and the two layers of which are short-circuited.

In addition, the thickness of the first layer of aluminum wiring is rendered smaller than that of the second layer of aluminum wiring.

DETAILED DESCRIPTION OF THE INVENTION

Figure 1:
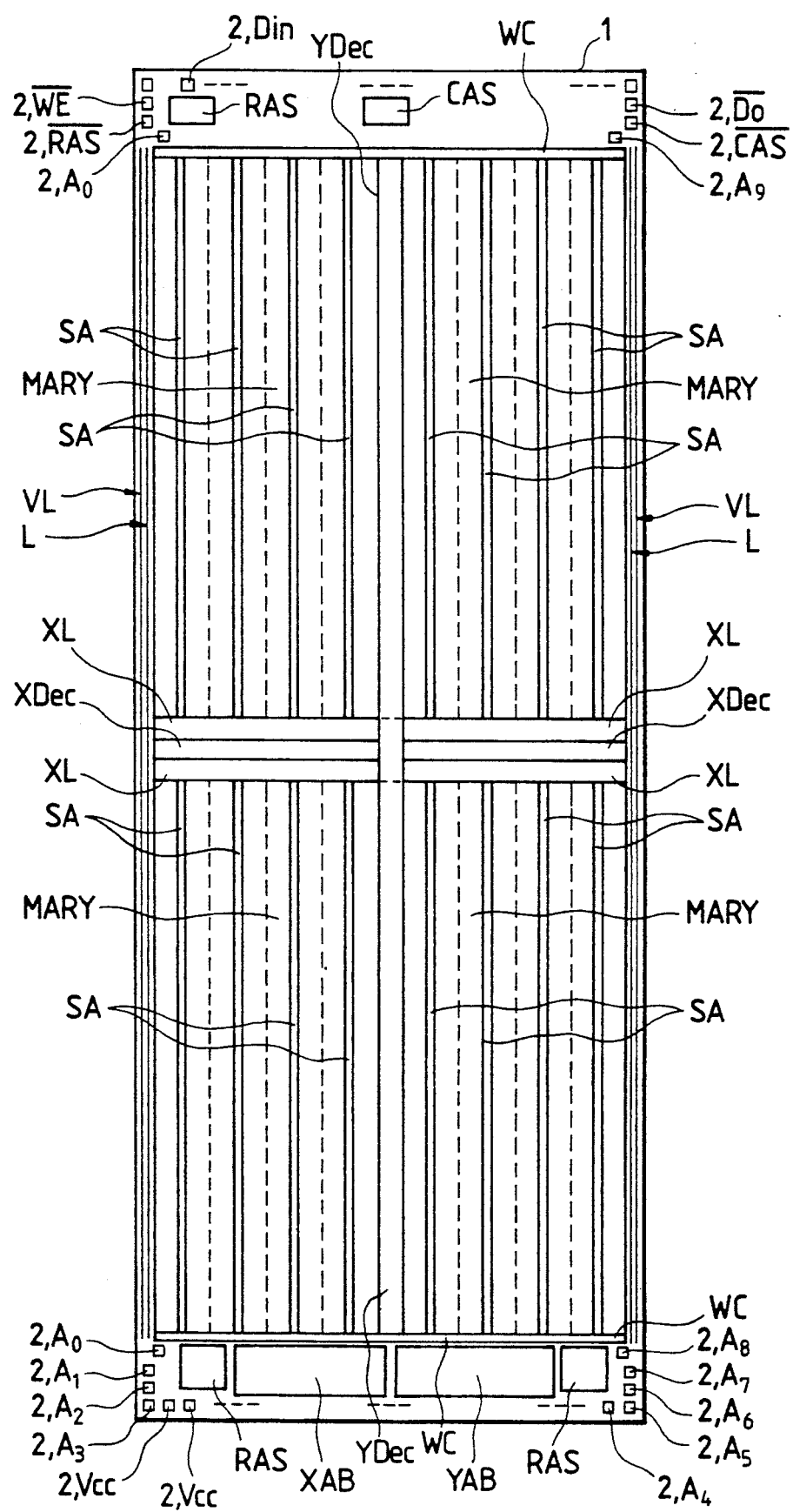
FIGS. 1 is a chip layout plan of a DRAM which is an embodiment of the present invention.
Figure 2:
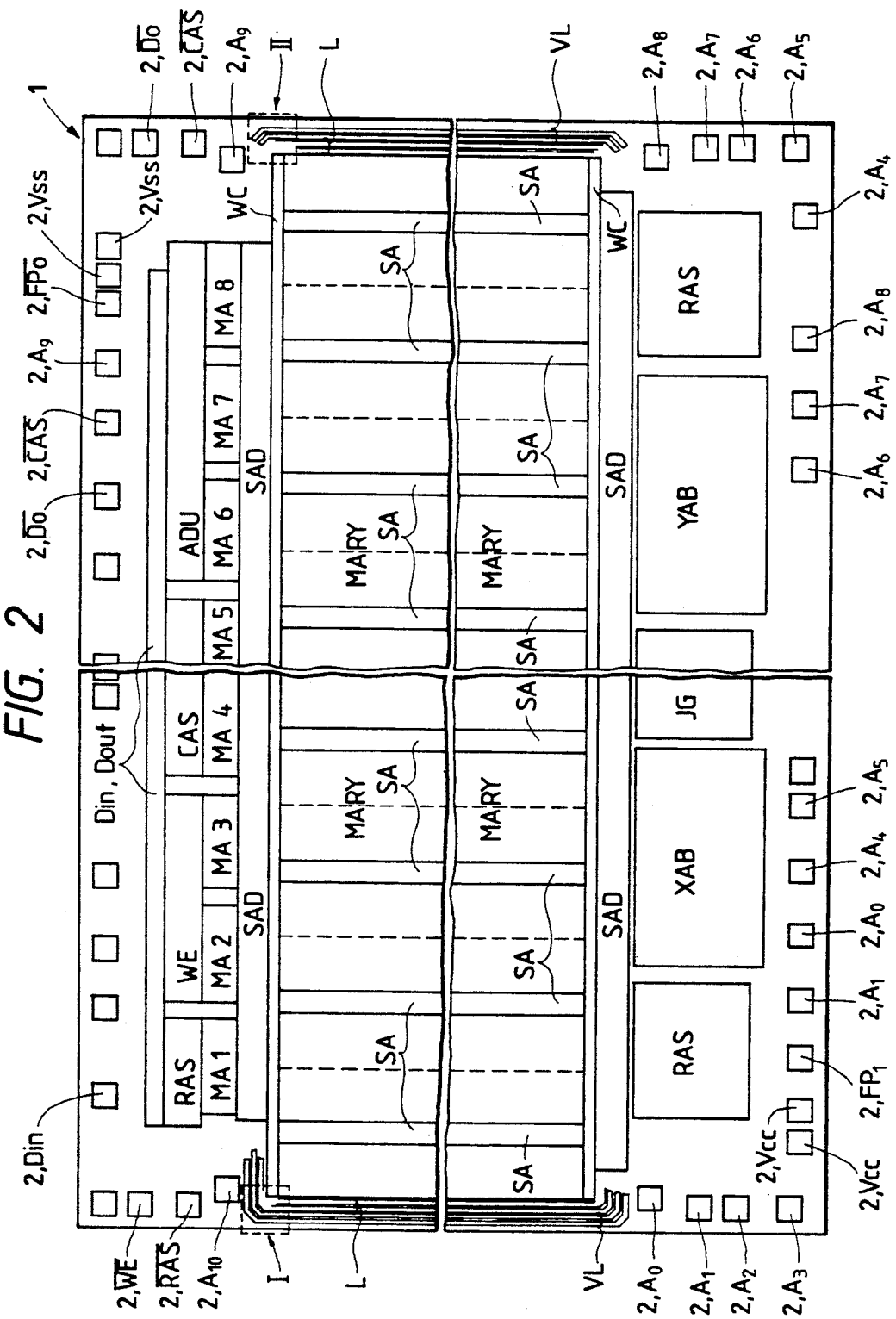
FIG. 2 is an enlarged block diagram of the peripheral circuits of the DRAM.

A DRAM which is one embodiment of the present invention is illustrated in FIG. 1 (a chip layout plan) and FIG. 2 (an enlarged block diagram of peripheral circuits).

As shown in FIG. 1, a DRAM 1 is constructed on a semiconductor substrate which is made of single-crystal silicon. The DRAM 1 is configured of 4 [Mbits]×1 [bit] (or 1 [Mbit]×4 [bits]).

By way of example, the DRAM 1 is formed of a rectangular chip having shorter latera of 6.38 [mm] and longer latera of 17.38 [mm]. It is encapsulated with a resin by the use of an SOJ, a ZIP or the like though not depicted.

As shown in FIGS. 1 and 2, external terminals (bonding pads) 2 are arranged at the outermost peripheral parts of the DRAM 1 and along parts of the shorter latera and longer latera of the rectangular chip. The external terminals 2 arranged on one shorter latus side (the upper shorter latus side) are respectively used for an address signal $A_{10}$, a row address strobe signal $\overline{RAS}$, a write enable signal $\overline{WE}$, a data input signal Din, a data output signal $\overline{Do}$, a column address strobe signal $\overline{CAS}$, an address signal $A_9$, a function pad $\overline{FP_0}$, and a reference voltage $V_{ss}$. The external terminals 2 arranged on the other shorter latus side (the lower shorter latus side) are respectively used for address signals $A_0$-$A_8$, a power source voltage $V_{cc}$, and a function pad $FP_1$.

The external terminals 2 to be used as the function pads $\overline{FP_0}$ and $FP_1$ can be changed-over to a page mode, a nibble mode and a static column mode when pieces of bonding wire are to be connected thereto. The ground potential, 0 [V] of circuitry, for example, is applied as the reference voltage $V_{ss}$. The operating potential, 5 [V] of the circuitry, for example, is applied as the power source voltage $V_{cc}$. Each of the external terminals 2 for the reference voltage $V_{ss}$ and the external terminals 2 for the power source voltage $V_{cc}$ is subjected to so-called double bonding or triple bonding in which a plurality of bonding wire pieces are connected. This bonding method is adopted for a measure against noise.

A memory cell array MARY is arranged at the central part of the DRAM 1. The memory cell array MARY is broadly divided into four. Each of the divisional memory cell arrays MARY is constructed so as to have a large memory capacity of 1 [Mbit]. The divided individual memory cell array MARY is subdivided into four. As shown in FIGS. 1 and 2, sense amplifiers SA are arranged at the central part of each of the subdivided memory cell arrays MARY and along the longer latus of the rectangular chip (in the row direction of the DRAM). Complementary data lines extending in the memory cell array MARY in the column direction of the DRAM are connected to the sense amplifiers SA. That is, the DRAM 1 is constructed in accordance with the folded bit line organization.

Y-decoders YDec are respectively arranged between the two, right and left memory cell arrays MARY on the upper latus side as broadly divided and between the two, right and left memory cell arrays MARY on the lower latus side. X-decoders XDec and word driver and word latch circuits XL are respectively arranged between the two, upper and lower memory cell arrays MARY on the left side and between the two, upper and lower memory cell arrays MARY on the right side. Word clear circuits WC are arranged at the end parts of the memory cell arrays MARY opposite to the X-decoders XDec.

Each memory cell array MARY is constructed by arranging a plurality of memory cells, not shown, in the shape of a matrix. The memory cell is constructed of a series circuit consisting of a memory cell selecting MISFET, and an information storing capacitor which is connected to one semiconductor region of the MISFET. The memory cell selecting MISFET is formed into the n-channel type. The information storing capacitor is formed as a stacked structure in which a lower-layer electrode (polycrystalline silicon film), a dielectrics film, and an upper-layer electrode (polycrystalline silicon film) are successively stacked on the silicon substrate. A power source voltage, $\frac{1}{2} V_{cc}$ is applied to the upper-layer electrode. The power source voltage, $\frac{1}{2} V_{cc}$ is the intermediate potential (about 2.5 [V]) between the power source voltage $V_{cc}$ and the reference voltage $V_{ss}$.

The complementary data lines are connected to the other semiconductor region of the memory cell selecting MISFET of the memory cell. The complementary data lines are connected to the sense amplifiers SA as described before, and they are also connected to an input/output signal line (I/O line) through an input/output selecting MISFET (Y-switch). The input/output selecting MISFET is connected to the Y-decoder YDec through a Y-select signal line. The gate electrode of the memory cell selecting MISFET is connected to a word line. The word lines are extended in the row direction of the memory cell array MARY, and are connected to the X-decoder XDec through the word driver circuit.

As shown in FIGS. 1 and 2, peripheral circuits which principally include reference clock signal generators are arranged on one shorter latus side of the DRAM 1. That is, on one shorter latus side, there are arranged the major, reference clock signal generators of the first-stage circuit of a row address strobe-group circuit (RAS-group circuit) RAS and the first-stage circuit of a column address strobe-group circuit (CAS-group circuit) CAS, data input/output circuits ($D_{in}/D_{out}$ circuits) $D_{in}$ and $D_{out}$, a write enable circuit (WE circuit) WE, an upper-latus address circuit ADU, main amplifiers MA1-MA8, and power source circuits SAD for the sense amplifiers.

The first-stage circuit of the row address strobe-group circuit RAS, which is the reference clock signal generator, is arranged near the external terminal 2 for the row address strobe signal $\overline{RAS}$ in order to reduce the delay of the signal. Likewise, the first-stage circuit of the column address strobe-group circuit CAS is arranged near the external terminal 2 for the column address strobe signal $\overline{CAS}$.

The row address strobe signal $\overline{RAS}$ is used in all the peripheral circuits of the peripheral circuits on one shorter latus side and the peripheral circuits on the other shorter latus side. Since the external terminals 2 for the row address strobe signal $\overline{RAS}$ are arranged on one shorter latus side as described before, the first-stage circuit of the row address strobe-group circuit RAS and generators for the $\overline{RAS}$-group reference clock signals to be used on the shorter latus side are arranged on one shorter latus side.

Peripheral circuits which principally include address-group circuits are arranged on the other shorter latus side of the DRAM 1. That is, on the other shorter latus side, there are arranged the address-group circuits of an X-address buffer XAB and a Y-address buffer YAB, the next-stage circuits of the row address strobe-group circuit RAS, and an X-generator circuit JG. Since the external terminals 2 for the address signals $A_0$–$A_8$ are arranged on the other shorter latus side, the address-group circuits are arranged near them.

Figure 3:
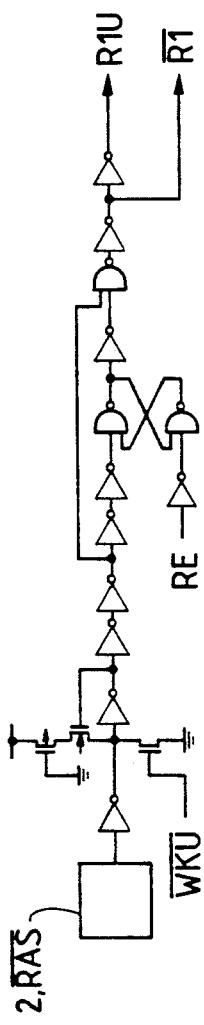

As shown in FIG. 3, the first-stage circuit of the row address strobe-group circuit RAS and the generator for the $\overline{RAS}$-group reference clock signal are constructed of a multistage inverter structure in order to shape waveforms and to intensify driving abilities. The first-stage circuit of the row address strobe-group circuit RAS produces the reference clock signal (internal clock signal) $\overline{R1}$ which has the earliest timing in the $\overline{RAS}$-group reference clock signals. The reference clock signal $\overline{R1}$ is used as a reference clock signal which is input to the clock signal generators arranged on one and the other shorter latus sides. Besides, as shown in FIG. 3, the reference clock signal $\overline{R1}$ serves to produce the reference clock signal R1U which is used on one shorter latus side (the upper latus side). Incidentally, in FIG. 3, symbol $\overline{WKU}$ denotes a wake-up signal, and symbol RE a RAS end signal.

Figure 4:
FIGS. 4 thru 10 are equivalent circuit diagrams of the essential portions of the DRAM.

The reference clock signal $\overline{R1}$ produced by the first-stage circuit of the row address strobe-group circuit RAS is transmitted from one shorter latus side to the other shorter latus side (the lower latus side) through wiring (reference clock signal-wiring) L shown in FIGS. 1 and 2, and is input to the next-stage circuits of the row address strobe-group circuit RAS. The next-stage circuits of the row address strobe-group circuit RAS are arranged in order to shape the waveform and intensify the driving ability of the reference clock signal $\overline{R1}$ drawn around by the wiring L. As shown in FIG. 4 (an equivalent circuit diagram), the next-stage circuit of the row address strobe-group circuit RAS is constructed of a multistage inverter structure. It produces the reference clock signal R2, and the reference clock signal R1D which is used on the other shorter latus side.

Figure 5:
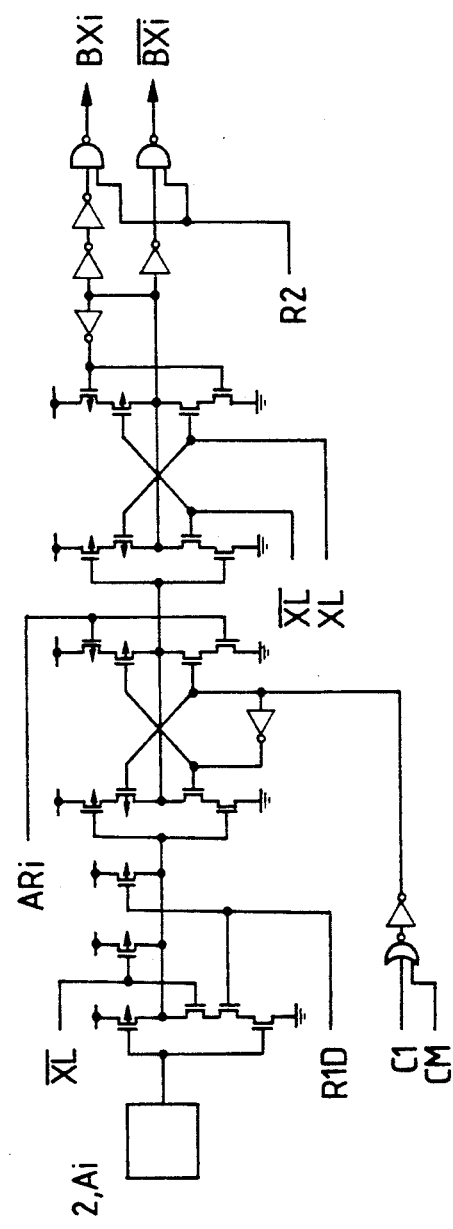
Figure 6:
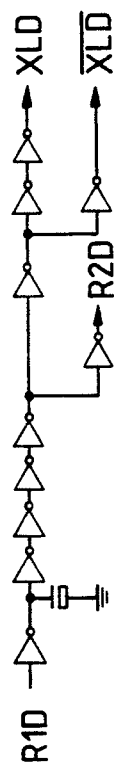

As shown in FIG. 5 (an equivalent circuit diagram), the X-address buffer XAB arranged on the shorter latus side is activated by the reference clock signals R1D and R2 which are produced by the next-stage circuit of the row address strobe-group circuit RAS. That is, the reference clock signals R1D and R2 are used as control signals for accepting the address signals $A_i$ ($i=0, 1, 2, \ldots, 8$) into the X-address buffer XAB. The speed of acceptance of the address signals $A_i$ is greatly influential on the operating speed of the DRAM 1 concerning an address setup time and an address hold time. That is, the access time of the DRAM 1 is rendered shorter as the speed of acceptance of the address signals $A_i$ based on the reference clock signals R1D and R2 is higher. The X-address buffer XAB produces signals BXi and $\overline{BXi}$ which are output to the X-decoder XDec. By the way, in FIG. 5, symbol XL and $\overline{XL}$ denote X-address latch signals, symbol C1 the reference clock signal produced by the column address strobe-group circuit CAS, symbol CM a clear mode signal, and symbol ARi a refresh address signal. As shown in FIG. 6 (an equivalent circuit diagram), X-address latch signals XLD and $\overline{XLD}$ which are used on the other latus side are produced by the word latch circuit XL on the basis of the reference clock signal R1D.

Figure 7:
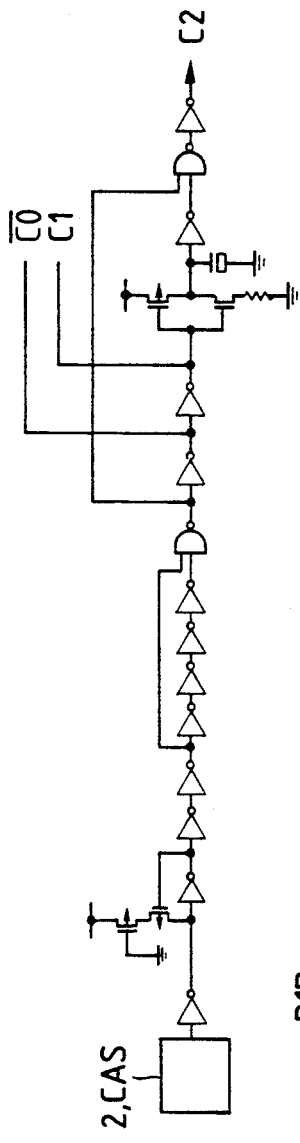

As shown in FIG. 7 (an equivalent circuit diagram), the column address strobe-group circuit CAS is constructed of a multistage inverter structure likewise to the first-stage circuit of the row address strobe-group circuit RAS. The column address strobe-group circuit CAS produces the reference clock signals $\overline{C0}$, C1 and C2 which have the earliest timings in the $\overline{CAS}$-group reference clock signals. Among these reference clock signals, the reference clock signal C1 is transmitted from one shorter latus side (the upper latus side) to the other shorter latus side (the lower latus side) through wiring (reference clock signal-wiring) L and is used for forming a Y-address latch signal YL.

Figure 8:
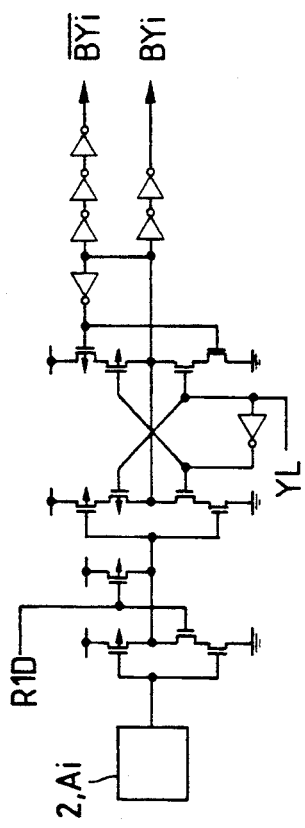
Figure 9:
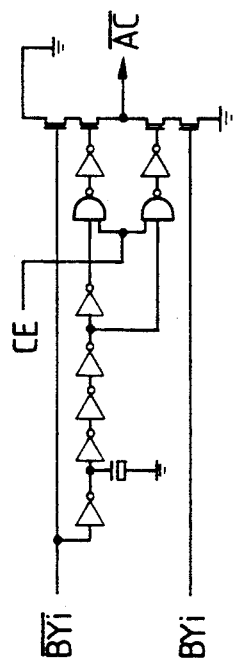
Figure 10:
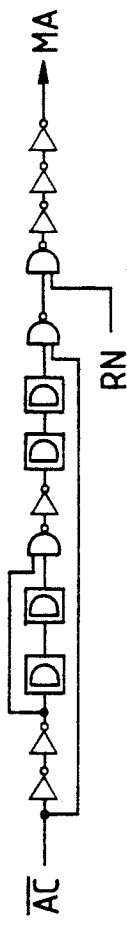

As shown in FIG. 8 (an equivalent circuit diagram), the Y-address buffer YAB arranged on the other shorter latus side is activated by the Y-address latch signal YL and the reference clock signal R1D produced by the next-stage circuit of the row address strobe-group circuit RAS. That is, the reference clock signal R1D and the Y-address latch signal YL are used as control signals for accepting the address signals $A_i$ ($i=0, 1, 2, \ldots, 8$) into the Y-address buffer YAB. The speed of acceptance of the address signals $A_i$ is greatly influential on the operating speed of the DRAM 1, likewise to the speed of accepting the address signals $A_i$ into the X-address buffer XAB. The Y-address buffer YAB produces output signals BYi and $\overline{BYi}$ to the Y-decoder YDec, and also produces the activation signal $\overline{AC}$ of the main amplifier MA as illustrated in FIG. 9 (an equivalent circuit diagram). This activation signal $\overline{AC}$ is produced by the Y-address buffer YAB arranged on the other shorter latus side and is transmitted to one shorter latus side, whereupon it is subjected to waveform shaping and driving ability intensification and then input to the main amplifier MA as illustrated in FIG. 10 (an equivalent circuit diagram). Incidentally, symbol CE in FIG. 9 denotes a column enable signal, and symbol RN in FIG. 10 denotes a RAS normal signal.

Figure 11:
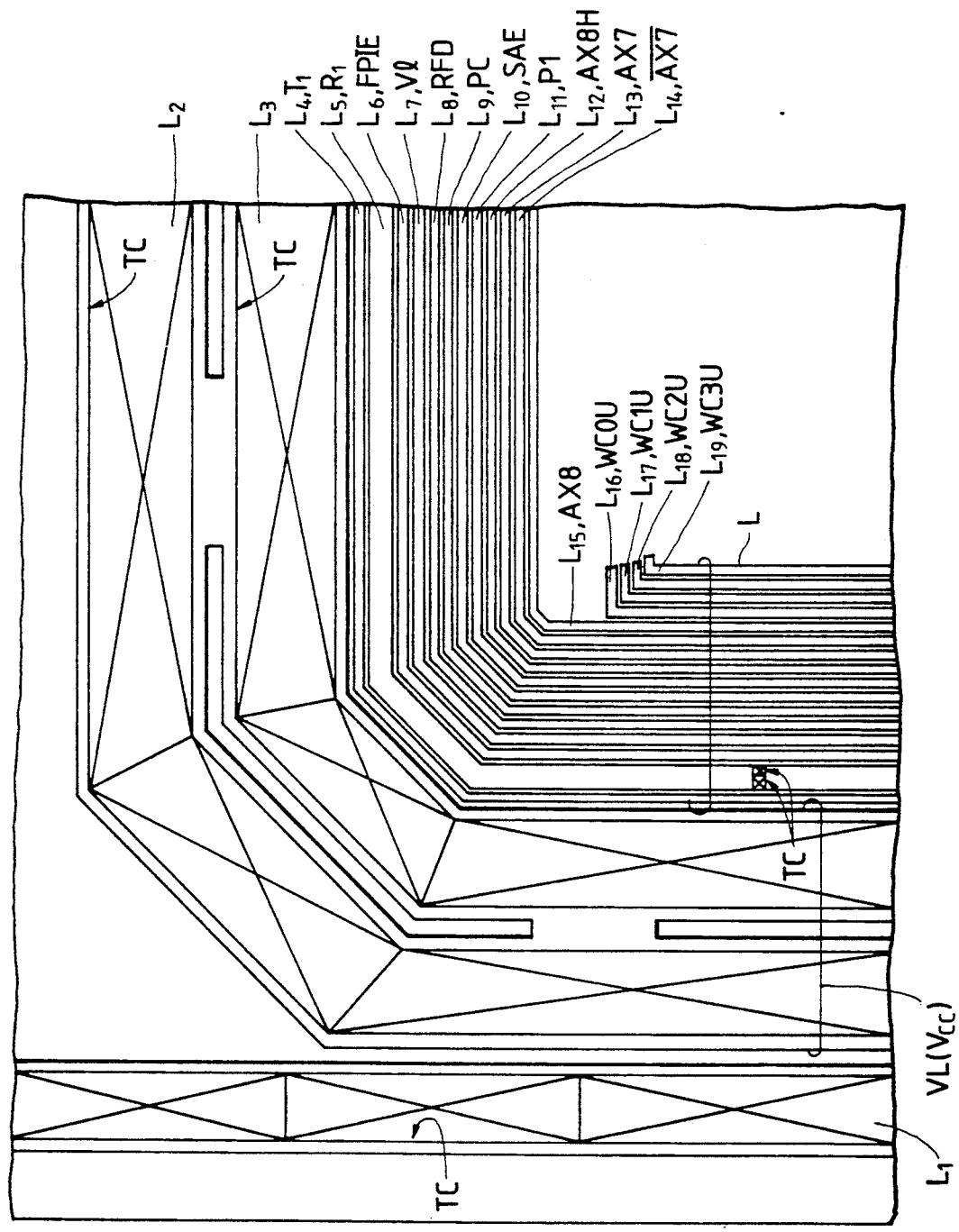
FIG. 11 is an enlarged plan view of a part indicated by symbol I in FIG. 2.
Figure 12:
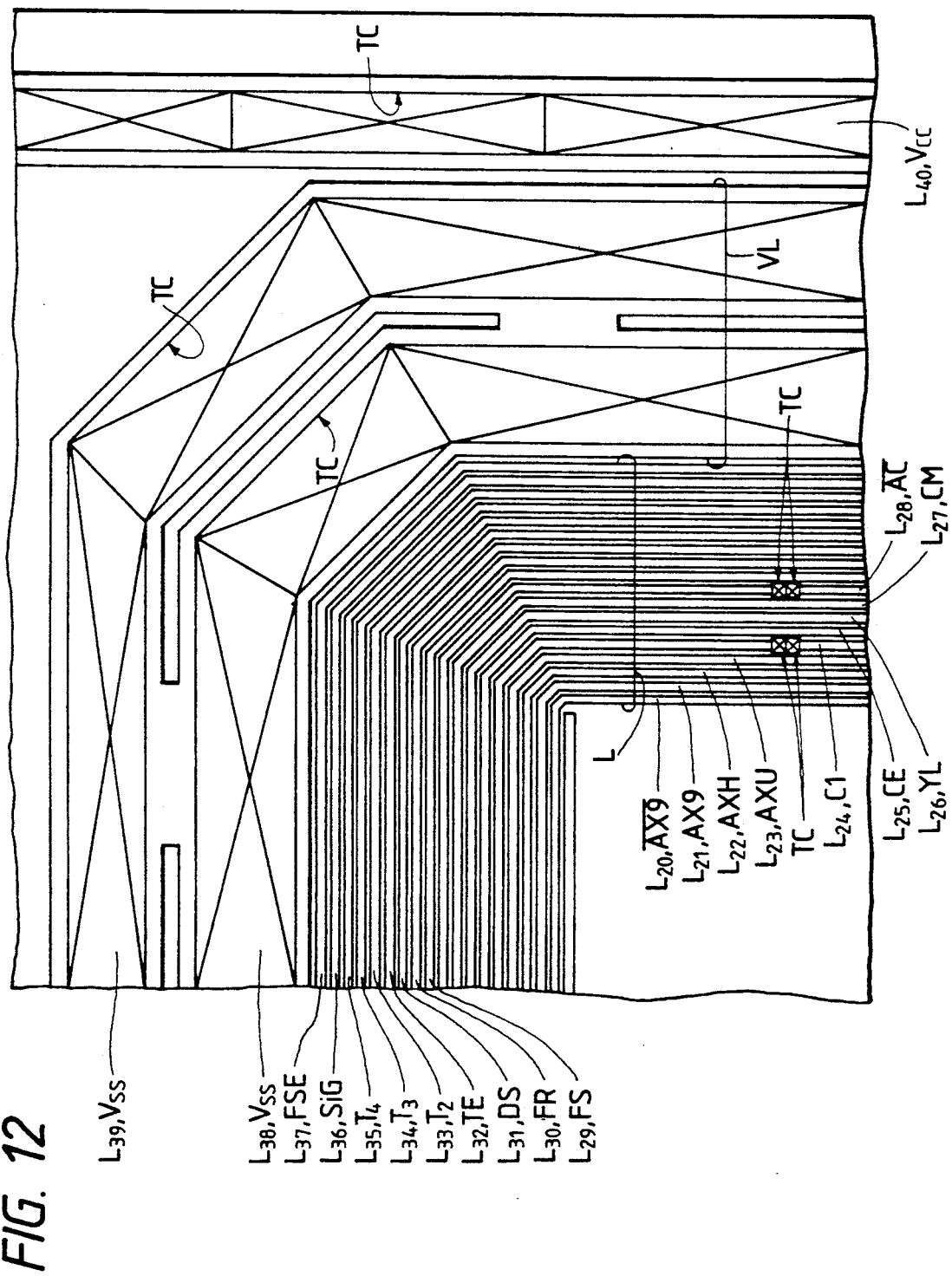
FIG. 12 is an enlarged plan view of a part indicated by symbol II in FIG. 2.

As shown in FIG. 1, FIG. 2, FIG. 11 (an enlarged plan view of a part indicated by symbol I in FIG. 2) and FIG. 12 (an enlarged plan view of a part indicated by symbol II in FIG. 2), the DRAM 1 is so constructed that power source wiring VL and the signal wiring L extend along the longer latera of the rectangular chip. As illustrated in detail in FIG. 11, the power source wiring VL of power source-wiring leads $L_2$ and $L_3$ and the signal wiring L of signal wiring leads $L_4$–$L_{19}$ are extended from one shorter latus side to the other shorter latus side along the left longer latus of the DRAM 1. As illustrated in detail in FIG. 12, the power source wiring VL of power source-wiring leads $L_{38}$ and $L_{39}$ and the signal wiring L of signal wiring leads $L_{20}$–$L_{37}$ are extended from one shorter latus side to the other shorter latus side along the right longer latus of the DRAM 1. The power source wiring VL and the signal wiring L are laid by utilizing small areas defined between the longer latera of the DRAM 1 and the edges of the memory cell array MARY.

Here, wiring leads $L_1$ and $L_{40}$ of double-layer wiring structure form a guard ring which is arranged at the outermost periphery of the rectangular chip. They prevent impurities from entering the rectangular chip from outside.

The power source voltage $V_{cc}$ is applied to the power source-wiring leads $L_2$ and $L_3$, while the reference voltage $V_{ss}$ is applied to the power source-wiring leads $L_{38}$ and $L_{39}$. These leads of the power source wiring VL are configured so as to extend outside the leads of the signal wiring L and inside the guard ring. The part of the power source wiring VL arranged along the longer latus of the rectangular chip is constructed of a double-layer wiring structure in which a first wiring layer and a second wiring layer are placed one over the other and then short-circuited. The DRAM 1 of this embodiment is constructed of a double-layer aluminum wiring structure, the first and second wiring layers of which are both made of aluminum wiring leads. In this manner, the part of the power source wiring VL along the longer latus is so formed that the resistance thereof can be lowered to the utmost so as to absorb noise as quickly as possible. On the other hand, the part of the power source wiring VL arranged along the shorter latus of the rectangular chip is formed only of the second wiring layer. Since this part of the power source wiring is made up of the second wiring layer, it can be laid in the area for arranging the peripheral circuits, and the effect of enhancing the density of integration is achieved. The first and second aluminum wiring layers are made of pure aluminum, or aluminum doped with 0.5 weight-% of Cu (copper) against migration or/and 1.5 weight-% of Si (silicon) against alloy spikes. The first wiring layer and second wiring layer of the power source wiring VL have equal wiring width dimensions, and they are short-circuited through contact holes TC formed in an inter-layer insulator film. The contact holes TC of the power source wiring VL are provided in substantially the whole region of the power source wiring VL in the extending direction thereof. That is, the contact holes TC are distributed so as to lower the resistance of the power source wiring VL to the utmost. The wiring width dimension of the power source wiring VL is, for example, about 25 [μm].

Among the signal wiring leads L mentioned above, the signal wiring lead $L_4$ is a wiring lead ($T_1$) for testing the characteristics of the DRAM 1. The signal wiring lead $L_5$ is a reference clock signal-wiring lead which transmits the reference clock signal $\overline{R1}$. The signal wiring lead $L_6$ is a function pad interchange signal-wiring lead (FPIE). The signal wiring lead $L_7$ is a voltage limiter signal-wiring lead (V1). The signal wiring lead $L_8$ is a refresh signal-wiring lead (RFD). The signal wiring lead $L_9$ is a precharge signal-wiring lead (PC). The signal wiring lead $L_{10}$ is a sense amplifier enable signal-wiring lead (SAE). The signal wiring lead $L_{11}$ is a sense amplifier drive signal-wiring lead (P1). The signal wiring leads $L_{12}$–$L_{15}$ are X-group internal address signal-wiring leads (AX8H, $\overline{AX7}$, AX8). The signal wiring leads $L_{16}$–$L_{19}$ are word line clear signal-wiring leads (WC0U, WC1U, WC2U, WC3U).

The signal wiring leads $L_{20}$–$L_{23}$ are X-group internal address signal-wiring leads ($\overline{AX9}$, AX9, AXH, AXU). The signal wiring lead $L_{24}$ is a reference clock signal-wiring lead which transmits the CAS-group reference clock signal C1. The signal wiring lead $L_{25}$ is a column enable signal-wiring lead (CE). The signal wiring lead $L_{26}$ is a Y-address latch signal-wiring lead (YL). The signal wiring lead $L_{27}$ is a clear mode signal-wiring lead (CM). The signal wiring lead $L_{28}$ is an activation signal-wiring lead which transmits the activation signal $\overline{AC}$ of the main amplifier MA. The signal wiring lead $L_{29}$ is a function set signal-wiring lead (FS). The signal wiring lead $L_{30}$ is a function reset signal-wiring lead (FR). The signal wiring lead $L_{31}$ is a data select signal-wiring lead (DS). The signal wiring lead $L_{32}$ is a test enable signal-wiring lead (TE). The signal wiring leads $L_{33}$–$L_{35}$ are wiring leads for testing characteristics ($T_2$, $T_3$, $T_4$) The wiring lead $L_{36}$ is a redundancy signature signal-wiring lead (SiG). The signal wiring lead $L_{37}$ is a function set enable signal-wiring lead (FSE).

The signal wiring leads L ($L_4$, $L_6$–$L_{23}$, $L_{25}$–$L_{27}$, $L_{29}$–$L_{37}$) except the RAS-group reference clock signal-wiring lead ($\overline{R1}$) $L_5$, CAS-group reference clock signal-wiring lead (C1) $L_{24}$ and activation signal-wiring lead ($\overline{AC}$) $L_{28}$ are constructed of a single-layer structure made of the second wiring layer (aluminum wiring). The second wiring layer has a thickness greater than that of the first wiring layer. More specifically, the first wiring layer is formed at a thickness of, for example, about 5000–6000 [Å] (5000 Å as a concrete instance), while the second wiring layer is formed at a thickness of, for example, about 8000–9000 [Å] (8000 Å as a concrete instance). This is intended to render the resistance of the second wiring layer as far as possible, and also to mitigate a step ascribable to the first wiring layer and enhance the step coverage of the second wiring layer. These signal wiring leads L are constructed at wiring width dimensions of, for example, about 2 [μm] and at intervals of, for example, about 1.5 [μm]. In regions underlying the signal wiring leads L constructed of the single-layer wiring structure, different signal wiring leads can be passed, so that the density of integration of the DRAM 1 can be heightened by effectively utilizing the wiring regions. By the way, these signal wiring leads L may well be constructed of the first layer of wiring.

Figure 13:
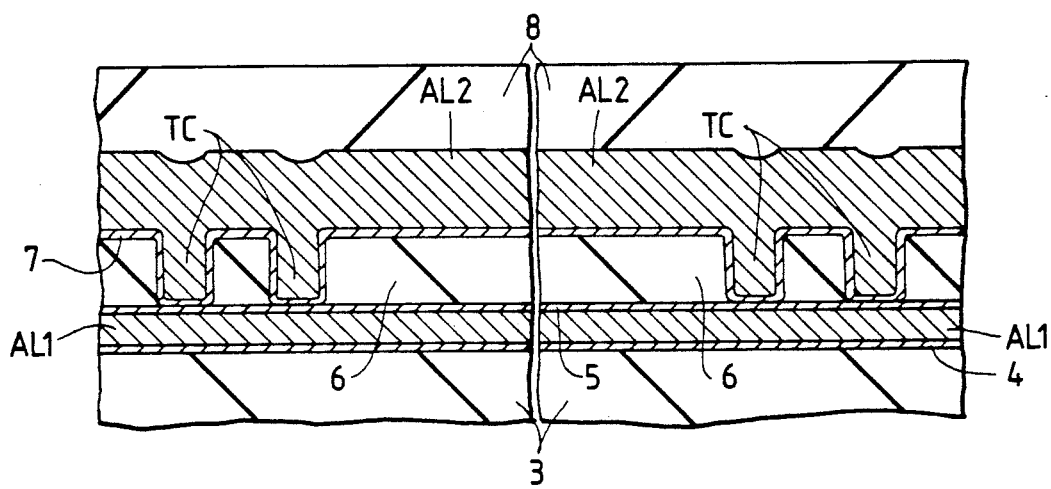
FIG. 13 is an enlarged sectional view of the essential portions of the reference clock signal-wiring of the DRAM.

The RAS-group reference clock signal-wiring lead ($\overline{R1}$) $L_5$, CAS-group reference clock signal-wiring lead (C1) $L_{24}$ and activation signal-wiring lead ($\overline{AC}$) $L_{28}$, namely, the major wiring leads of the reference clock signals are constructed of the double-layer wiring structure in which the first wiring layer and the second wiring layer are short-circuited, likewise to the power source-wiring leads VL. The sectional structure of the CAS-group reference clock signal-wiring lead (C1) $L_{24}$ as well as the activation signal-wiring lead ($\overline{AC}$) $L_{28}$ is shown in FIG. 13 (an enlarged sectional view of essential portions). As illustrated in FIG. 13, the first wiring layer AL1 and the second wiring layer AL2 are short-circuited by contact holes TC.

Further, the first layer of aluminum wiring AL1 is provided on the inter-layer insulator film 3 through a barrier metal layer 4 which is made of an $MoSi_2$ film having a thickness of, for example, 150 Å. Thus, the reaction between the aluminum wiring layer AL1 and the semiconductor substrate being a subbing material can be prevented. In addition, the first layer of aluminum wiring AL1 is overlaid with an $MoSi_x$ ($0<x<2$) film 5 which has an Si composition ratio smaller than that of the $MoSi_2$ film 4 and which is 200 Å thick by way of example. Owing to the fact that the $MoSi_x$ film 5 of the smaller Si composition ratio is provided on the aluminum wiring layer AL1 in this manner, it is possible to prevent the corrosion of the aluminum wiring layer AL1 attributed to an electrochemical reaction which occurs at the step of wet etching due to an intermetallic compound produced by aluminum and copper contained in the aluminum wiring layer AL1. Furthermore, the second layer of aluminum wiring AL2 is provided on an MoSi$_2$ film 7 which has a thickness of, for example, 150 Å. Thus, Mo (molybdenum) diffuses from the MoSi$_2$ film 7 into the aluminum wiring layer AL2, whereby electromigration and stress migration can be prevented. Accordingly, the lifetime of this aluminum wiring layer AL2 can be prolonged.

Besides, the contact holes TC are provided at predetermined intervals, for example, at intervals of 30 [μm] in a case where the wiring length of the reference clock signal-wiring lead is about 10 [mm]. The contact holes TC are provided in a plural number every predetermined interval for the purpose of preventing inferior contact and enhancing the available percentage of products. Since the RAS-group reference clock signal-wiring lead ($\overline{R1}$) L$_5$ is the most important, it is formed at a wiring width dimension of, for example, about 5 [μm]. The contact holes TC for connecting the first wiring layer and second wiring layer of the RAS-group reference clock signal-wiring lead ($\overline{R1}$) L$_5$ are provided in a number of two in the widthwise direction of the wiring every predetermined interval, because the wiring width dimension of this wiring lead is greater than that of any other wiring lead. Each of the CAS-group reference clock signal-wiring lead (C1) L$_{24}$ and the activation signal-wiring lead ($\overline{AC}$) L$_{28}$ is formed at a wiring width dimension of, for example, about 2 [μm]. The contact holes TC for connecting the first wiring layer and second wiring layer of each of the CAS-group reference clock signal-wiring lead (C1) L$_{24}$ and the activation signal-wiring lead ($\overline{AC}$) L$_{28}$ are provided in a number of two in the lengthwise direction of the wiring every predetermined interval, because the wiring width dimension of this wiring lead is smaller than that of any other wiring lead. In the section shown in FIG. 13, the first wiring layer AL1 is underlaid with the inter-layer insulator film 3 which covers the memory cell selecting MISFET and the information storing capacitor. An inter-layer insulator film 6 is interposed between the first wiring layer AL1 and the second wiring layer AL2. The inter-layer insulator film 6 is formed with the contact holes TC. A passivation film 8 is provided on the second wiring layer AL2.

Since the power source-wiring leads VL are constructed of the double-layer wiring structure as stated before and the word lines, not shown, extending in the memory cell array MARY are constructed of a double-layer wiring structure, the double-layer wiring structure of the major, reference clock signal-wiring leads are formed by the same manufacturing step as that of the power source-wiring leads and the word lines (merely by altering the pattern of a wiring forming mask), whereby they can be constructed without increasing the number of manufacturing steps. That is, since the double-layer wiring structure of the major, reference clock signal-wiring can be formed by the same manufacturing step as that of the other double-layer wiring structures, a manufacturing process can be relieved in correspondence with the step of forming the double-layer wiring structure of the major, reference clock signal-wiring. By the way, the double-layer wiring structure of the word lines is constructed in such a way that the word line (shunting word line) formed of the second wiring layer is connected through the first wiring layer to the word line which is formed of the same conductor layer as that of the gate electrode of the memory cell selecting MISFET of the memory cell. The complementary data lines and Y-select signal wiring, which extend in the memory cell array MARY, are made of the first layer of wiring.

In this manner, in the DRAM 1, the reference clock signal generator (RAS or/and CAS) and the address-group circuits (XAB, YAB), which are respectively arranged on the opposing shorter latus sides of the rectangular chip, are connected by the reference clock signal-wiring (L$_5$, L$_{24}$ or/and L$_{28}$) of the double-layer wiring structure which is extended along the longer latus of the rectangular chip and is short-circuited, whereby the resistance of the reference clock signal-wiring is rendered lower than in case of a single-layer wiring structure, and the propagating speed of the reference clock signal ($\overline{R1}$, C1 or/and $\overline{AC}$) can be heightened, so that the margins of the address setup time and the address hold time can be enhanced to raise the operating speed of the DRAM 1.

Figure 14:
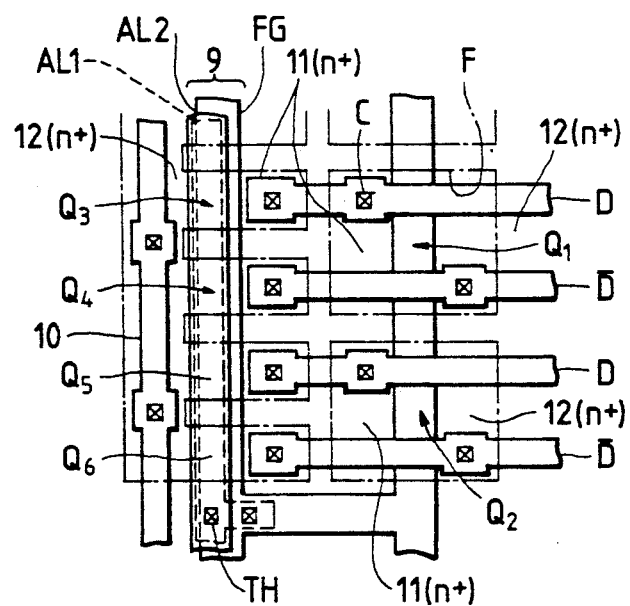
FIG. 14 is a plan view showing the layout of a data line precharge circuit portion in a peripheral circuit area.
Figure 15:
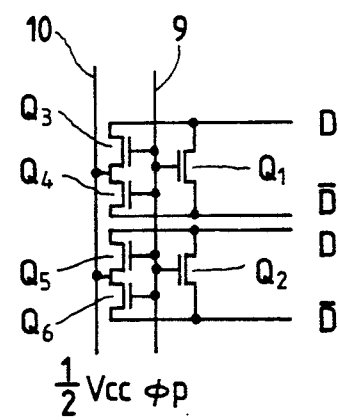
FIG. 15 is an equivalent circuit diagram of the data line precharge circuit portion shown in FIG. 14.

FIG. 14 shows the layout of a peripheral circuit (data line precharge circuit) portion, while FIG. 15 is an equivalent circuit diagram of the peripheral circuit shown in FIG. 14.

As illustrated in FIGS. 14 and 15, a precharge signal φ$_p$ which passes through the wiring 9 of the peripheral circuit is delayed long by a capacitive load such as the gate capacitances of n-channel MISFETs Q$_1$–Q$_6$ constituting this peripheral circuit, and hence, an access time and a precharge time are long. Therefore, a high speed operation has been hampered. This problem, however, can be solved in such a way that the wiring 9 has its wiring resistance lowered with a structure in which the first and second layers of aluminum wiring AL1 and AL2 (reinforcing wiring) connected with each other via a through hole TH are connected to a gate electrode FG made of the first layer of polycrystalline silicon wiring by way of example. In a case where the reinforcing wiring for the gate electrode FG is formed of only one layer of aluminum wiring, the resistance of the wiring can be sufficiently lowered only by increasing the width thereof. In contrast, the use of the two layers of aluminum wiring AL1 and AL2 as stated above does not enlarge the chip size and is advantageous. Incidentally, in FIGS. 14 and 15, symbol F denotes a field insulator film for isolating the elements, and symbols D and $\overline{D}$ denote data lines. Besides, numeral 10 indicates a wiring lead for a precharge potential of $\frac{1}{2}$ V$_{cc}$, and this wiring lead is formed of the first layer of aluminum wiring AL1. Further, numerals 11 and 12 indicate source and drain regions of, for example, the n$^+$-type, and these regions are provided in self-alignment to the gate electrode FG within an active region which is enclosed with the field insulator film F. The expedient thus far described is applicable also to peripheral circuits other than the data line precharge circuit.

Figure 16:
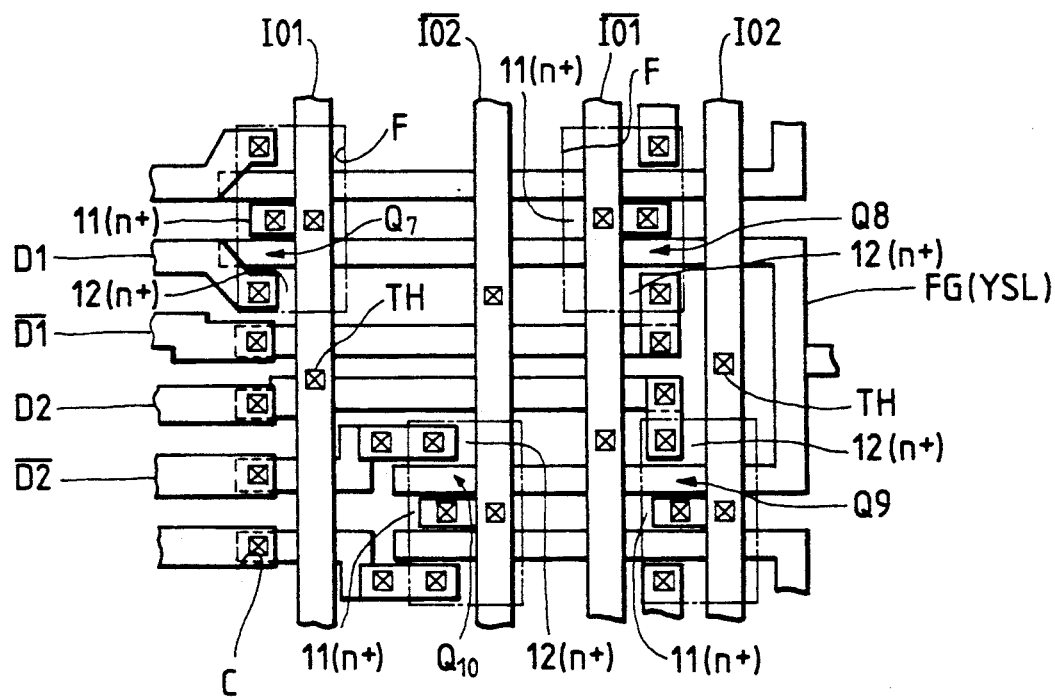
FIG. 16 is a plan view showing the layout of an I/O transfer circuit portion.
Figure 17:
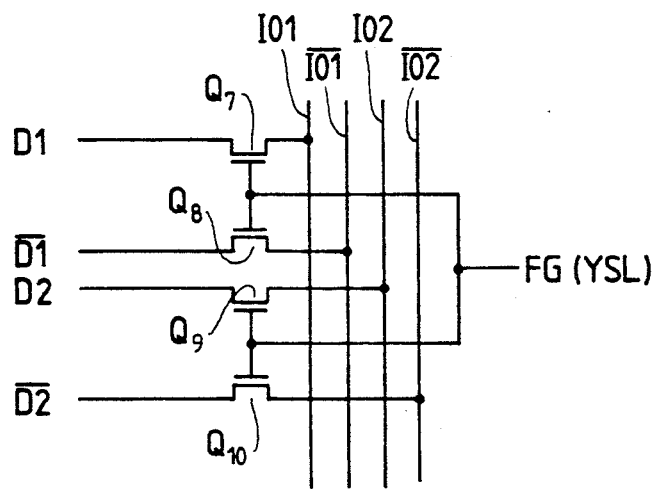
FIG. 17 is an equivalent circuit diagram of the I/O transfer circuit portion shown in FIG. 16.

FIG. 16 is a layout plan of an I/O transfer circuit portion, while FIG. 17 is an equivalent circuit diagram of the I/O transfer circuit portion shown in FIG. 16.

As illustrated in FIGS. 16 and 17, in the I/O transfer circuit portion, I/O lines $\overline{IO1}$, IO1, $\overline{IO2}$ and IO2 being access paths in the memory cell array MARY are constructed of the structure in which the first layer of aluminum wiring AL1 and the second layer of aluminum wiring AL2 are placed one over the other, as in the foregoing, whereby the resistance of the wiring can be lowered to heighten the speed of data line access. Incidentally, in FIGS. 16 and 17, symbols D1, $\overline{D1}$, D2 and $\overline{D2}$ denote data lines, symbols $Q_7$-$Q_{10}$ denote n-channel MISFETs for Y-switches, and symbol FG denotes a gate electrode which serves also as Y-switch wiring YSL.

Figure 18:
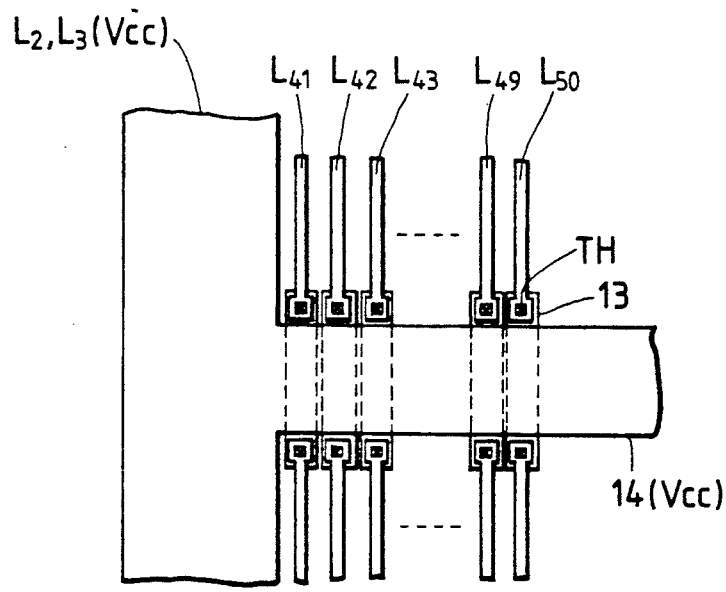
FIG. 18 is a plan view showing the cross-under portion between power source wiring and signal wiring.

FIG. 18 shows a cross-under portion which is defined between the first layer of aluminum wiring and the second layer of aluminum wiring.

As illustrated in FIG. 18, a power source-wiring lead 14 which is laid along the shorter latus of the rectangular chip from the power source-wiring leads $L_2$ and $L_3$ (of the double-layer structure consisting of the first layer of aluminum and the second layer of aluminum) extended along the longer latus of the rectangular chip is made of the second layer of aluminum wiring AL2. Parts where wiring leads $L_{41}$, $L_{42}$, ... and $L_{50}$ each being made of the second layer of aluminum wiring AL2 intersect the power source-wiring lead 14 are brought to a cross-under structure. More specifically, cross-under wiring leads 13 each being made of the first layer of aluminum wiring AL1 are formed under the second layer of aluminum wiring AL2 which constructs the power source-wiring lead 14. Since, in this case, the first layer of aluminum wiring AL1 has the smaller thickness and the higher resistance as described before, it is rendered wider than each of the wiring leads $L_{41}$, $L_{42}$, ... and $L_{50}$ made of the second layer of aluminum wiring AL2, so as to lower the resistance.

As stated above, it is fundamental that the second layer of aluminum wiring AL2 having the greater thickness and lower resistance is employed for the wiring leads $L_{41}$, $L_{42}$, ... and $L_{50}$ which run over long distances, while the first layer of aluminum wiring AL1 the width of which is broadened is employed for the cross-under wiring leads 13 of short distance. In the converse case, unless the width of the first layer of aluminum wiring AL1 is considerably broadened, it is difficult to lower the resistance. Therefore, the operating speed lowers due to an enlarged chip size and an increased capacitive load.

Figure 19:
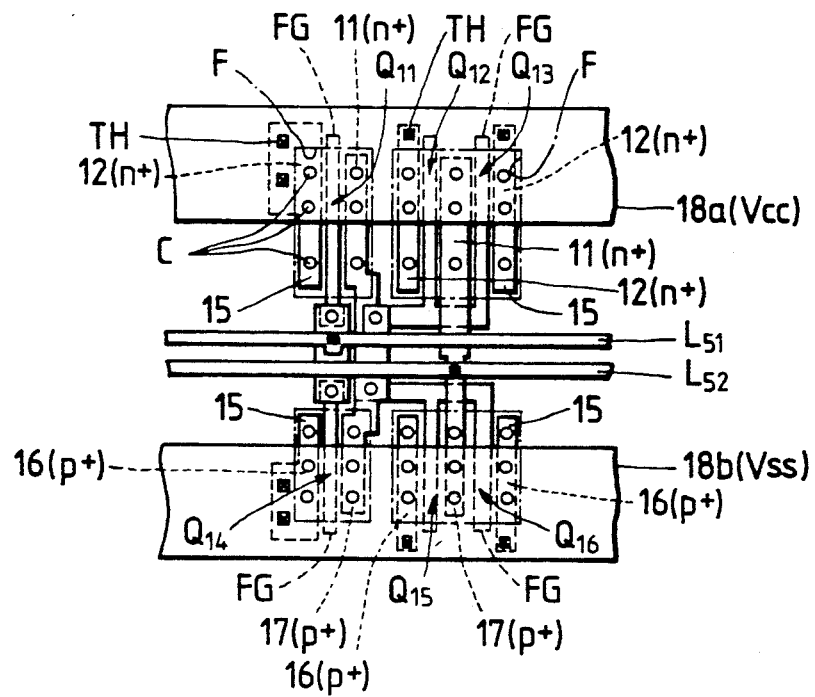
FIG. 19 is a plan view showing the layout of any CMOS inverter circuits in the peripheral circuit area.

FIG. 19 shows the layout of any of CMOS inverter circuits in the peripheral circuits.

As illustrated in FIG. 19, a wiring lead 15 within the circuit block of the peripheral circuit is fundamentally made of the first layer of aluminum wiring AL1, while a wiring lead $L_{51}$ or $L_{52}$ located between the circuit blocks is made of the second layer of aluminum wiring AL2. Each of n-channel MISFETs $Q_{11}$-$Q_{13}$ is constructed of a source region 12, a drain region 11 and a gate electrode FG. Besides, symbols 16 and 17 denote source and drain regions of, for example, the p+-type, and these regions and a gate electrode FG constitute each of p-channel MISFETs $Q_{14}$-$Q_{16}$. In this case, the first layers of aluminum wiring AL1 can be brought into direct contact with the source regions 12, 16 and drain regions 11, 17 and the gate electrodes FG of the MISFETs $Q_{11}$-$Q_{16}$ through contact holes C. Therefore, layout rules around the contact holes C can be rendered small by making the wiring 15 within the circuit block out of the first layer of aluminum wiring AL1 as described above. Accordingly, the layout area can be rendered small.

Effects which are attained by typical aspects of performance of the present invention will be briefly explained below:

The operating speed of a DRAM can be heightened.

Moreover, the stepped part of the second layer of aluminum wiring attributed to the first layer of aluminum wiring can be prevented from breaking.

Although, in the above, the present invention has been concretely described in conjunction with embodiments, it is needless to say that the present invention is not restricted to the foregoing embodiments, but that it can be variously altered within a scope not departing from the purport thereof.

By way of example, the present invention is applicable, not only to a dynamic RAM employing three or more layers of aluminum wiring, but also to various kinds of semiconductor integrated circuit devices each employing at least two layers of aluminum wiring.

In addition, the present invention is applicable, not only to a DRAM as a separate device, but also to a DRAM built in a microcomputer in the shape of a rectangle.

What is claimed is:

1. A semiconductor integrated circuit device comprising:
   (a) a memory cell array including a plurality of memory cells on a rectangular semiconductor substrate having a pair of opposing longer sides and a pair of opposing shorter sides;
   (b) a first peripheral circuit adjacent one of said shorter sides and a second peripheral circuit adjacent the other of said shorter sides on said semiconductor substrate, wherein said memory cell array is located between said first and second peripheral circuits;
   (c) an external terminal to be supplied with a predetermined signal other than a power supply signal, said external terminal being located on said semiconductor substrate;
   (d) a first wiring coupling said external terminal to said first peripheral circuit to provide said predetermined signal to said first peripheral circuit, wherein said first peripheral circuit includes means for producing a predetermined output signal in response to said predetermined signal;
   (e) a second wiring coupling said first peripheral circuit to said second peripheral circuit for providing said predetermined output signal of said first peripheral circuit to said second peripheral circuit, wherein said second wiring is located at a region of said substrate other than said memory cell array and extends along one of said longer sides in a peripheral area of said semiconductor substrate between said memory cell array and said one of said longer sides, and
   (f) a third and a fourth wiring formed on both sides of said second wiring and extending along said second wiring,
   wherein said second wiring comprises a first conductive layer and a second conductive layer on said first conductive layer, said first and second conductive layers being electrically coupled to each other to provide a reduced resistance to said second wiring along said one of said longer sides of the substrate between said first and second peripheral circuits, and
   further wherein said third and fourth wirings are single-layer wirings each comprised either of said first conductive layer or said second conductive layer.

2. A semiconductor integrated circuit device according to claim 1, wherein said first and second conductive layers are each comprised of an aluminum layer.

3. A semiconductor integrated circuit device according to claim 2, wherein said second conductive layer has a thickness greater than that of said first conductive layer.

4. A semiconductor integrated circuit device according to claim 1, wherein each of said plurality of memory cells comprises a switching element and an information storing element.

5. A semiconductor integrated circuit device according to claim 4, wherein said switching element is an MISFET and said information storing element is a capacitor, and wherein said MISFET and capacitor are coupled in series with one another.

6. A semiconductor integrated circuit device according to claim 5, wherein said means for producing a predetermined output signal in said first peripheral circuit includes a plurality of inverters arranged so as to generate a first cock signal, as said predetermined output signal, from a row address strobe signal, as said predetermined signal, supplied to said external terminal.

7. A semiconductor integrated circuit device according to claim 6, wherein said second peripheral circuit has a plurality of inverters arranged so as to generate a second clock signal from said first clock signal.

8. A semiconductor integrated circuit device according to claim 7, wherein said first and second conductive layers are each comprised of an aluminum layer.

9. A semiconductor integrated circuit device according to claim 8, wherein said second conductive layer has a thickness greater than that of said first conductive layer.

10. A semiconductor integrated circuit device according to claim 1, further comprising:
  (f) a further external terminal to be supplied with a predetermined level of voltage, said further external terminal being arranged on said semiconductor substrate; and
  (g) a fifth wiring coupling said further external terminal and said first and second peripheral circuits.

11. A semiconductor integrated circuit device according to claim 10, wherein said predetermined level of voltage is one of a power supply voltage and a reference voltage.

12. A semiconductor integrated circuit device according to claim 11, wherein a part of said fifth wiring comprises said first conductive layer and said second conductive layer, and wherein said first and second conductive layers are electrically coupled to each other.

13. A semiconductor integrated circuit device according to claim 12, wherein said first and second conductive layers are each comprised of an aluminum layer.

14. A semiconductor integrated circuit device according to claim 13, wherein said second conductive layer has a thickness greater than that of said first conductive layer.

15. A semiconductor integrated circuit device according to claim 1, wherein said third and fourth wirings are comprised of said second conductive layer.

16. A semiconductor integrated circuit device according to claim 15, wherein said second conductive layer comprises an aluminum layer.

17. A semiconductor integrated circuit device comprising:

(a) a memory cell array including a plurality of memory cells on a rectangular semiconductor substrate;

(b) a first peripheral circuit and a second peripheral circuit on said semiconductor substrate;

(c) an external terminal to be supplied with a predetermined signal other than a power supply signal, said external terminal being located on said semiconductor substrate;

(d) a first wiring coupling said external terminal to said first peripheral circuit to provide said predetermined signal to said first peripheral circuit, wherein said first peripheral circuit includes means for producing a predetermined output signal in response to said predetermined signal;

(e) a second wiring coupling said first peripheral circuit to said second peripheral circuit for providing said predetermined output signal of said first peripheral circuit to said second peripheral circuit; and (f) a third and a fourth wiring formed on both sides of said second wiring and extending along said second wiring, wherein said second wiring comprises a first conductive layer and a second conductive layer on said first conductive layer, said first and second conductive layers being electrically coupled to each other to provide a reduced resistance to said second wiring between said first and second peripheral circuits, and further wherein said third and fourth wirings are single-layer wirings each comprised either of said first conductive layer or said second conductive layer.

18. A semiconductor integrated circuit device according to claim 17, wherein said first and second conductive layers are each comprised of an aluminum layer.

19. A semiconductor integrated circuit device according to claim 18, wherein said second conductive layer has a thickness greater than that of said first conductive layer.

20. A semiconductor integrated circuit device according to claim 17, wherein each of said plurality of memory cells comprises a switching element and an information storing element.

21. A semiconductor integrated circuit device according to claim 20, wherein said switching element is a MISFET and said information storing element is a capacitor, and wherein said MISFET and capacitor are coupled in series with one another.

22. A semiconductor integrated circuit device according to claim 21, wherein said means for producing a predetermined output signal in said first peripheral circuit includes a plurality of inverters arranged so as to generate a first clock signal, as said predetermined output signal, from a row address strobe signal, as said predetermined signal, supplied to said external terminal.

23. A semiconductor integrated circuit device according to claim 22, wherein said second peripheral circuit has a plurality of inverters arranged so as to generate a second clock signal from said first clock signal.

24. A semiconductor integrated circuit device according to claim 23, wherein said first and second conductive layers are each comprised of an aluminum layer.

25. A semiconductor integrated circuit device according to claim 24, wherein said second conductive layer has a thickness greater than that of said first conductive layer.

26. A semiconductor integrated circuit device according to claim 17, further comprising:
   (g) a further external terminal to be supplied with a predetermined level of voltage, said further external terminal being arranged on said semiconductor substrate; and
   (h) a fifth wiring coupled to said further external terminal and said first and second peripheral circuits.

27. A semiconductor integrated circuit device according to claim 26, wherein said predetermined level of voltage is one of a power supply voltage and a reference voltage.

28. A semiconductor integrated circuit device according to claim 27, wherein a part of said fifth wiring comprises said first conductive layer and said second conductive layer, and wherein said first and second conductive layers are electrically coupled to each other.

29. A semiconductor integrated circuit device according to claim 28, wherein said first and second conductive layers are each comprised of an aluminum layer.

30. A semiconductor integrated circuit device according to claim 29, wherein said second conductive layer has a thickness greater than that of said first conductive layer.

31. A semiconductor integrated circuit device according to claim 17, wherein said third and fourth wirings are comprised of said second conductive layer.

32. A semiconductor integrated circuit device according to claim 31, wherein said second conductive layer comprises an aluminum layer.

* * * * *